(12) United States Patent
Watanabe et al.

(10) Patent No.: US 7,905,131 B2
(45) Date of Patent: Mar. 15, 2011

(54) APPARATUS AND METHOD FOR DETECTING RESIN LEAK

(75) Inventors: Tatsuya Watanabe, Anjo (JP); Masahiko Imoto, Kariya (JP); Yoshinari Goshima, Toyohashi (JP)

(73) Assignee: Denso Corporation, Kariya (JP)

( * ) Notice: Subject to any disclaimer, the term of this patent is extended or adjusted under 35 U.S.C. 154(b) by 340 days.

(21) Appl. No.: 12/214,159

(22) Filed: Jun. 17, 2008

(65) Prior Publication Data
US 2008/0314121 A1  Dec. 25, 2008

(30) Foreign Application Priority Data
Jun. 19, 2007  (JP) .................. 2007-161718

(51) Int. Cl.
*G01M 3/26* (2006.01)
(52) U.S. Cl. ......................... 73/40; 73/40.5 R
(58) Field of Classification Search ............. 73/40–49.8, 73/52
See application file for complete search history.

(56) References Cited

U.S. PATENT DOCUMENTS

| 5,461,256 A * | 10/1995 | Yamada et al. ............... 257/679 |
| 5,948,991 A * | 9/1999 | Nomura et al. ................. 73/727 |
| 7,547,404 B2 * | 6/2009 | McBain et al. .............. 264/40.1 |
| 2006/0113693 A1 * | 6/2006 | McBain et al. .............. 264/40.1 |
| 2007/0264451 A1 * | 11/2007 | Yusa et al. .................... 428/34.1 |

FOREIGN PATENT DOCUMENTS

| JP | 05-021492 | 1/1993 |
| JP | 08-090596 | 4/1996 |
| JP | 2000031349 A * | 1/2000 |

* cited by examiner

*Primary Examiner* — David A. Rogers
(74) *Attorney, Agent, or Firm* — Harness, Dickey & Pierce, PLC (57) ABSTRACT

A resin leak detector includes a pressure sensor element and a leak determination unit. The pressure sensor element detects a pressure in a case cavity. That is, when resin leaks into a space between an upper circuit case and a lower circuit case, the pressure in the case cavity decreases temporarily. The decrease of the pressure in the case cavity is detected by the pressure sensor element based on comparison between a detected pressure and a predetermined lower limit. The resin leak into the upper and lower circuit case is detected without cutting an outer case of an electronic device such as an acceleration sensor or the like.

12 Claims, 12 Drawing Sheets

APPARATUS AND METHOD FOR DETECTING RESIN LEAK

CROSS REFERENCE TO RELATED APPLICATION

The present application is based on and claims the benefit of priority of Japanese Patent Application No. 2007-161718 filed on Jun. 19, 2007, the disclosure of which is incorporated herein by reference.

FIELD OF THE INVENTION

The present disclosure generally relates to a method and apparatus for detecting resin leak in a course of producing an electronic device.

BACKGROUND INFORMATION

Conventionally, an electronic device such as a hybrid IC disclosed, for example, in Japanese patent document JP-A-H05-21492 has an electronic circuit and a case that seals the circuit. More practically, the hybrid IC includes a hybrid IC substrate having a lead wire and a resin film for sealing the hybrid IC substrate. The resin film is molded by using a molding die. The molding die is an upper die and a lower die. In the lower die, plural holding members that protrude from an upper side of the lower die into a molding space are disposed. The holding members are movable in up-down directions. The hybrid IC substrate is arranged on the holding members protruding into the molding space with the lead wire inserted in a reception gutter. The holding members are retracted downward after melted resin is introduced into the molding space through a transfer passage and a submarine gate and the resin fills up the molding space. Then, the resin is further introduced into the molding space in a pressurized manner. The resin film for sealing the hybrid IC substrate is formed in the above-described manner.

The hybrid IC may be affected by the sealing resin if the electronic component on the hybrid IC substrate is directly sealed by the resin depending on the characteristic of the resin. That is, the connection between the electronic component and the substrate may be, for example, affected by the sealing resin in terms of electronic connection or the like. More practically, a reaction force and/or thermal stress may be applied to the connection from the sealing resin.

On the other hand, the electronic component on the hybrid IC substrate may be housed in an electronic circuit case in a sealing manner prior to the sealing by the resin. However, when the resin is introduced into the molding space, the hybrid IC substrate and the electronic circuit case are placed under resin introduction pressure. When pressurized, the hybrid IC substrate may be deformed and a gap may be formed between the substrate and the electronic circuit case. When the gap is formed, the resin may leak into the electronic circuit case. Further, the resin leak into the component case can not be detected from the appearance of the electronic device. Therefore, some of the electronic devices have to be sampled and cut, for example, to detect if the resin leaks into the electronic circuit case in the device.

SUMMARY OF THE INVENTION

In view of the above and other problems, the present disclosure provides a resin leak detection apparatus and method that detect a resin leak into an electronic circuit case without cutting an electronic device.

After experimenting and studying, the following method is invented for detecting the resin leak into the electronic circuit case.

That is, a method for resin leak detection in an electronic circuit case is by detecting resin leak based on a pressure in a case forming space where the resin is injected. In the method, an electronic circuit unit of an electronic device is placed in the case forming space to be sealed by an outer case that is made of resin injected therein, and the electronic circuit unit has an electronic component, a substrate that provides wiring for the electronic component and the electronic circuit case that houses and seals the electronic component together with the substrate. The method enables resin leak detection into the electronic circuit case without actually cutting the outer case because the resin leak into the electronic circuit case decreases the pressure in the case molding space in the mold.

Further, the resin leak is detected by measuring the residue amount of the resin in a resin injector when the resin is injected into the case molding space from the resin injector. In comparison to a predetermined amount of the resin used to mold the outer case in the case forming space, the resin leak into the electronic circuit case leads to an additional amount of resin injected into the case forming space, thereby causing a reduced amount of resin remaining in the resin injector. Therefore, the resin leak is detected without cutting the outer case based on the residue amount of resin in the resin injector.

Furthermore, the above method can be embodied as an apparatus that includes a pressure detector that detects the pressure in the case forming space, or a residue detector that detects the residue amount of the resin in the resin injector. By detecting either of the pressure in the case forming space or the residue resin amount in the resin injector, the detection result is compared with the criterion derived from the standard process for determining the resin leak.

BRIEF DESCRIPTION OF THE DRAWINGS

Other objects, features and advantages of the present invention will become more apparent from the following detailed description made with reference to the accompanying drawings, in which.

DETAILED DESCRIPTION

Embodiments of the present invention are provided to give examples of how the invention works in detail. In the present embodiment, the example describes a resin leak detection method pertinent to the present invention and a resin leak detection apparatus applied to the production of an acceleration sensor device for detecting the acceleration of a vehicle.

First Embodiment

Figure 1:
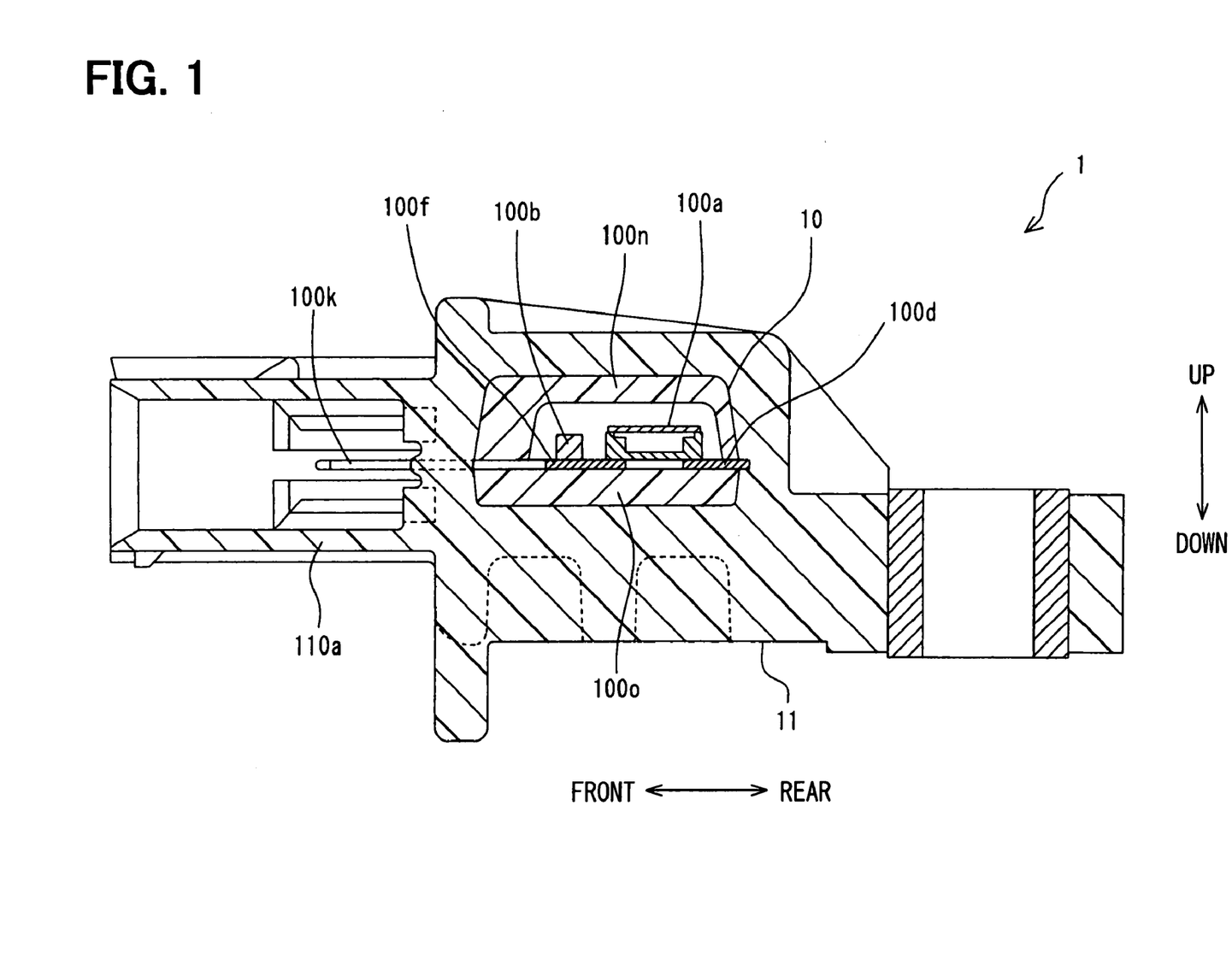
FIG. 1 is a cross-sectional view of an acceleration sensor device in the first embodiment of the present invention.
Figure 2:
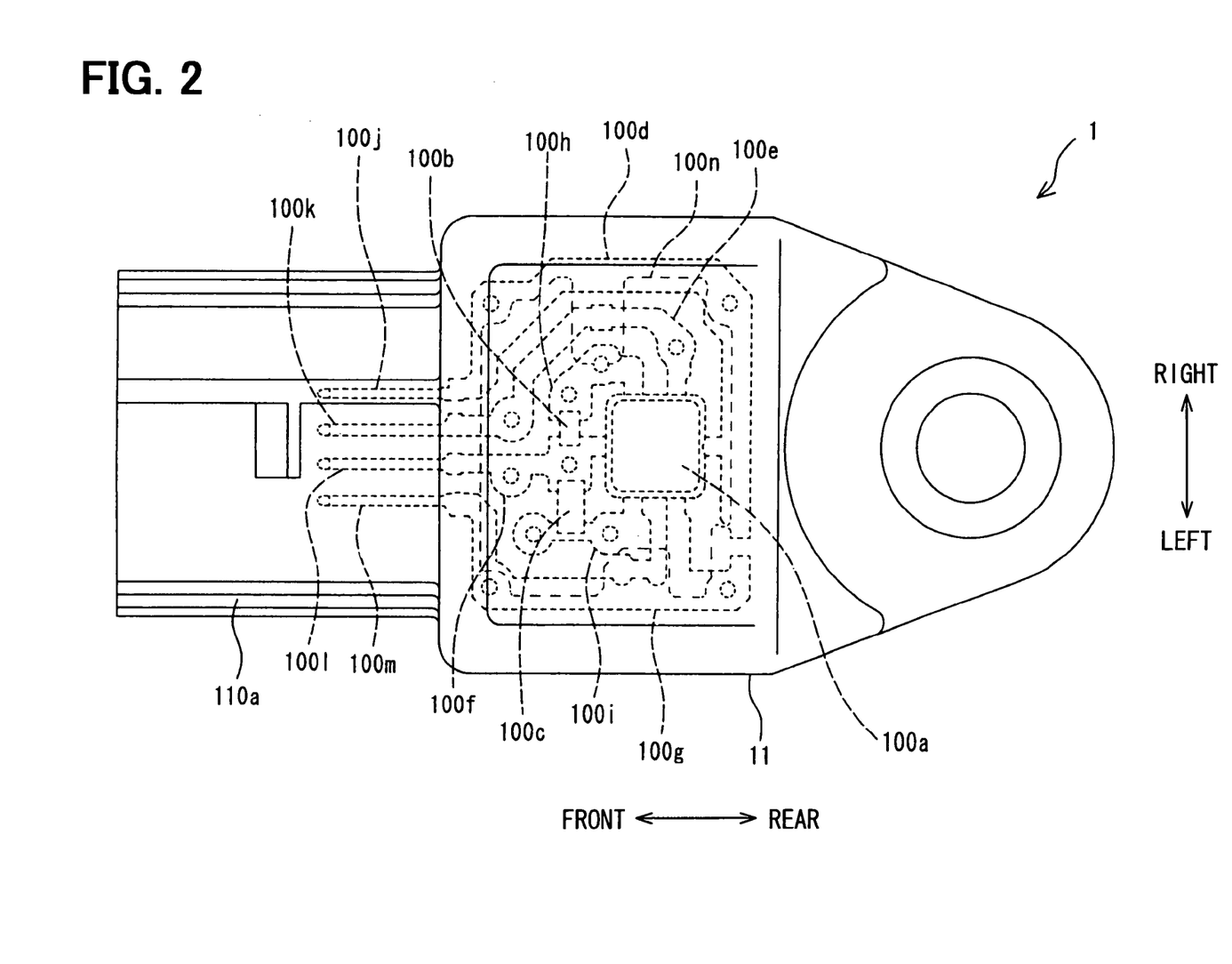
FIG. 2 is a top view of the acceleration sensor device.

First, the configuration of the acceleration sensor device is explained referring to FIG. 1 and FIG. 2. FIG. 1 is a cross-sectional view of the acceleration sensor device in the first embodiment of the present invention, and FIG. 2 is a top view of the acceleration sensor device. In addition, the front and rear directions, the up and down directions, and the right and left directions in the drawing are used only for the convenience of the description of the configuration.

As shown in FIGS. 1 and 2, an acceleration sensor device 1 (an electronic device) includes an electronic circuit part 10 and a case 11 (a housing).

The electronic circuit part 10 is a circuit that detects the acceleration of an appointed direction and outputs the detected acceleration after converting it into a corresponding signal. The electronic circuit part 10 includes an acceleration sensor element 100a (an electronic part), condensers 100b, 100c (electronic parts), wiring metal plates 100d-100i (wiring plates), connector terminals 100j-100m, an upper case 100n (an electronic circuit housing), and a lower case 100o (also an electronic circuit housing).

The acceleration sensor element 100a is an element that detects the acceleration of the appointed direction and outputs a corresponding signal. The condensers 100b, 100c are elements that operate the acceleration sensor element 100a. The wiring metal plates 100d-100i are board members made of metal in a certain shape for wiring the acceleration sensor element 100a and the condensers 100b, 100c. The acceleration sensor element 100a is soldered on the top surface of the wiring metal plates 100d-100i. Each of the condensers 100b, 100c is respectively soldered on top surfaces of the wiring metal plates 100f, 100h and on top surfaces of the metal plates 100f, 100i.

The connector terminals 100j-100m are board members made of metal in a certain shape for connecting a circuit that includes the acceleration sensor element 100a and the condensers 100b, 100c to an external device. The connector terminals 100j-100m are respectively formed on an end of the wiring metal plates 100d-100g.

The upper case 100n is a resin-made cylindrical member with a bottom attached thereto for covering the top surface side of the acceleration sensor element 100a and the wiring metal plates 100d-100i that have the condensers 100b, 100c soldered thereto.

The lower case 100o is a resin-made cylindrical member with a bottom attached thereto for covering the lower side of the wiring metal plates 100d-100i.

The acceleration sensor element 100a and the condensers 100b, 100c are housed and sealed in the upper case 100n and the lower case 100o.

The case 11 is a resin-made member for sealing the electronic circuit part 10 in a state that has the ends of the connector terminals 100j-100m projecting toward an outside of the cases 100n, 100o. On a front end face of the case 11, a connector housing 110a surrounding circumference of the projecting connector terminals 100j-100m substantially in a cylindrical shape is integrally formed in one body.

Figure 3:
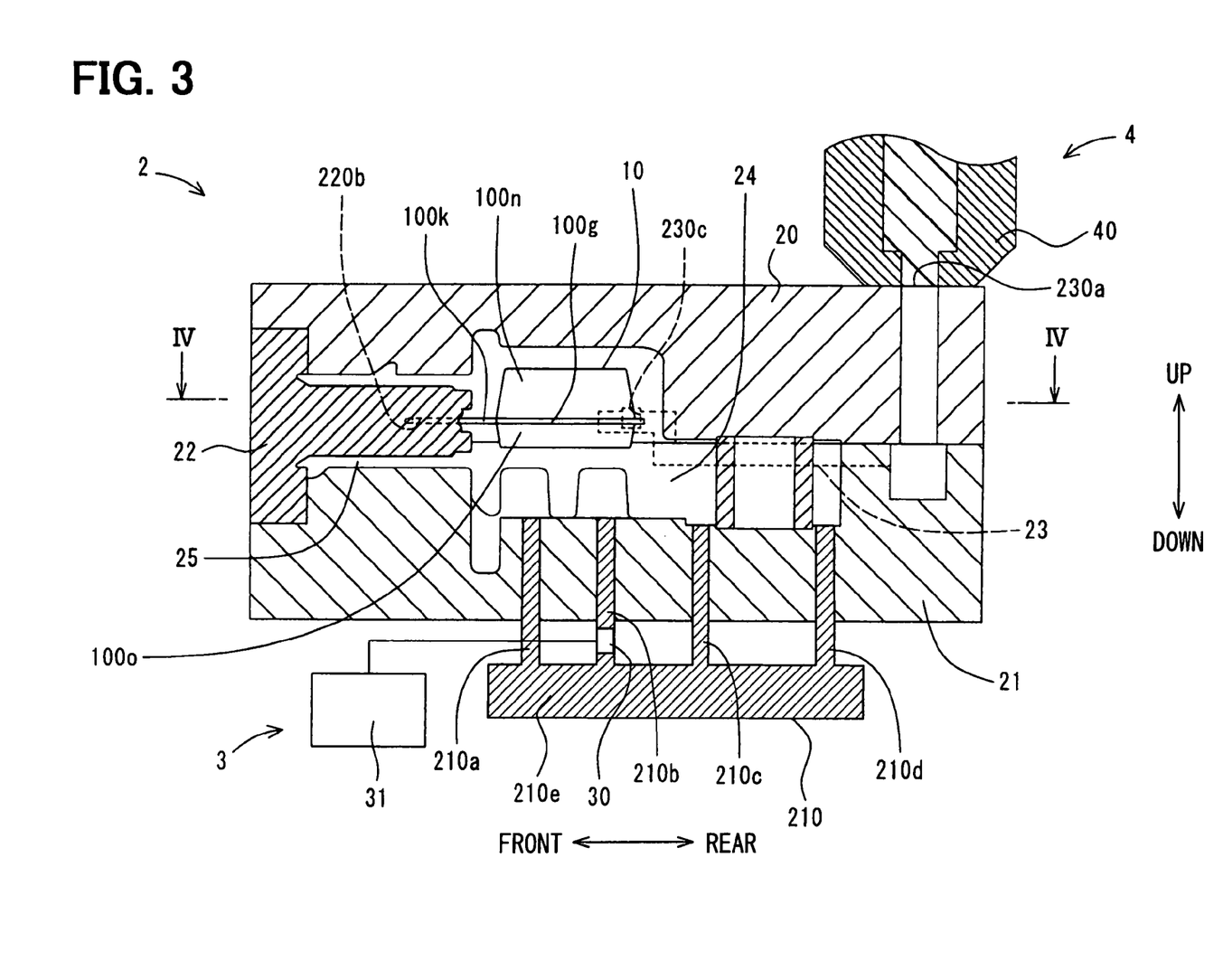
FIG. 3 is a cross-sectional view of a molding die and configuration of a resin leak detector.
Figure 4:
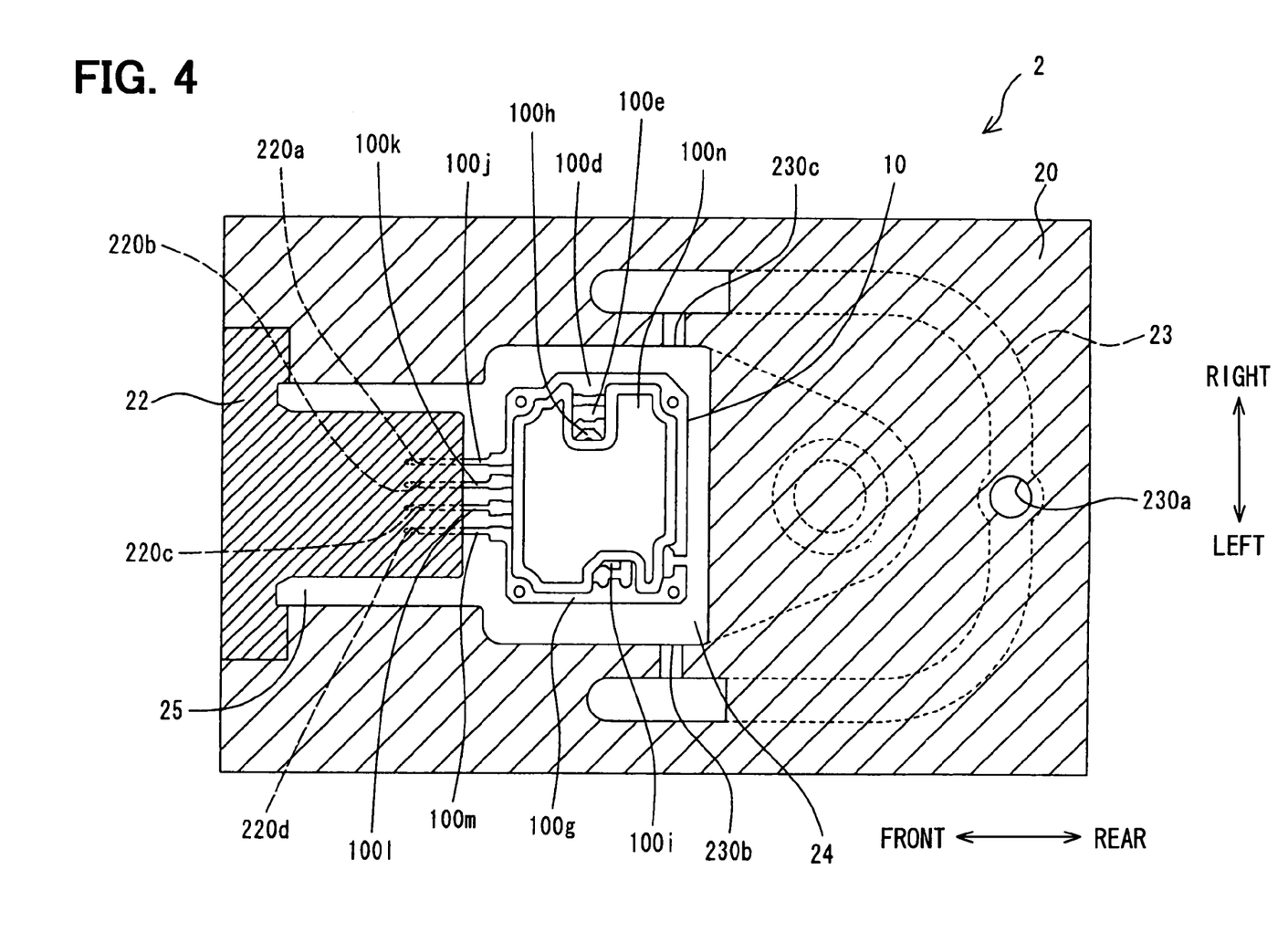
FIG. 4 is a cross-sectional view of the molding die along a IV-IV line seen in an arrow direction in FIG. 3.

FIGS. 3 and 4 illustrate the configuration of a molding die to mold a case. In addition, the configuration of a resin leak detector to detect a resin leak into the lower case 100o and the upper case 100n is explained. FIG. 3 is a cross-sectional view of the molding die and the configuration of the resin leak detector. In FIG. 3, only the electronic circuit part 10 is shown as a side view. FIG. 4 is a cross-sectional view of the molding die along a IV-IV line seen in an arrow direction in FIG. 3. In FIG. 4, only the electronic circuit part 10 is shown as a top view. In addition, the front and rear directions, the up and down directions, and the right and left directions in the drawing are used only for the convenience of the description of the configuration.

As shown in FIGS. 3 and 4, a molding die 2 includes an upper die 20, a lower die 21, a slide core 22 and a resin supply path 23.

The upper die 20 is a die to mold the upper part of the case 11.

The lower die 21 is a die to mold the lower part of the case 11. The lower die 21 has an ejector 210 to presses the molded case 11 away from the die 21 for release. The ejector 210 includes columnar ejector-pins 210a-210d and a board-shaped ejector-plate 210e. The ejector-pins 210a-210d penetrate the lower die 21 without a gap in the up and down direction, and are movable in the up and down direction. The downward ends of ejector-pins 210a-210d are fixed on the ejector-plate 210e. The ejector-pins 210a-210d are held in a downward-retreated position that aligns upward ends of the pins 210a-210d with the top surface of the lower die 21.

The slide core 22 is a die that molds a front end face of the case 11 and an internal circumference of the connector housing 110a. Fit hole parts 220a-220d are formed on a rear end face of the slide core 22 toward the front direction, which receive the connector terminals 100j-100m.

A case cavity 24 (a case molding space) for molding the case 11 that houses the electronic circuit part 10 is defined at a center by the upper die 20, the lower die 21 and by the slide core 22. The upward end of ejector-pin 210a constitutes a part of the internal circumference surface of the cavity 24. In addition, a connector housing cavity 25 for forming the connector housing 110a is formed in front of the case cavity 24 with one end of the cavity 25 connected to the case cavity 24. The cavity 25 is substantially in an elongated cylinder shape.

The resin supply path 23 is a passage to inject melted resin into the cavity 24 and the cavity 25 from the outside. An opening 230a on one end of the resin supply path 23 is formed on the top surface of the upper die 20. A nozzle 40 of a resin injector 4 is connected to the opening 230a. In addition, other openings 230b, 230c are formed at mutually facing positions on the internal circumference surface of the cavity 24.

The electronic circuit part 10 is positioned in the cavity 24 with the connector terminals 100j-100m kept in a condition being fitted in the fit hole parts 220a-220d.

A resin leak detection apparatus 3 is an apparatus detecting a resin leak into the upper case 100n and the lower case 100O based on a pressure in the case cavity 24. The resin leak detection apparatus 3 includes a pressure sensor element 30 (a pressure detector) and a resin leak detector 31 (a resin leak determination unit).

The pressure sensor element 30 is an element for detecting pressure in the cavity 24 that has resin injected therein. The pressure sensor element 30 is laid in the proximity of the downward end of the ejector-pin 210b. The sensor element 30 detects pressure in the axial direction of the ejector-pin 210b caused by the injected resin in the case cavity 24, and outputs a corresponding signal. The pressure sensor element 30 is connected to the resin leak detector 31.

The resin leak detector 31 is a device determining a resin leak into the upper case 100n and the lower case 100o based on an output signal of the pressure sensor element 30. To the resin leak detector 31, data of the pressure in the case cavity 24 in a standard process, that is, at a time when the process is performed normally, is set as data with a predetermined tolerance range. More practically, the data defines an upper limit of the pressure in the case cavity 24 and the lower limit of the pressure in the case cavity 24 in the standard process.

Figure 5:
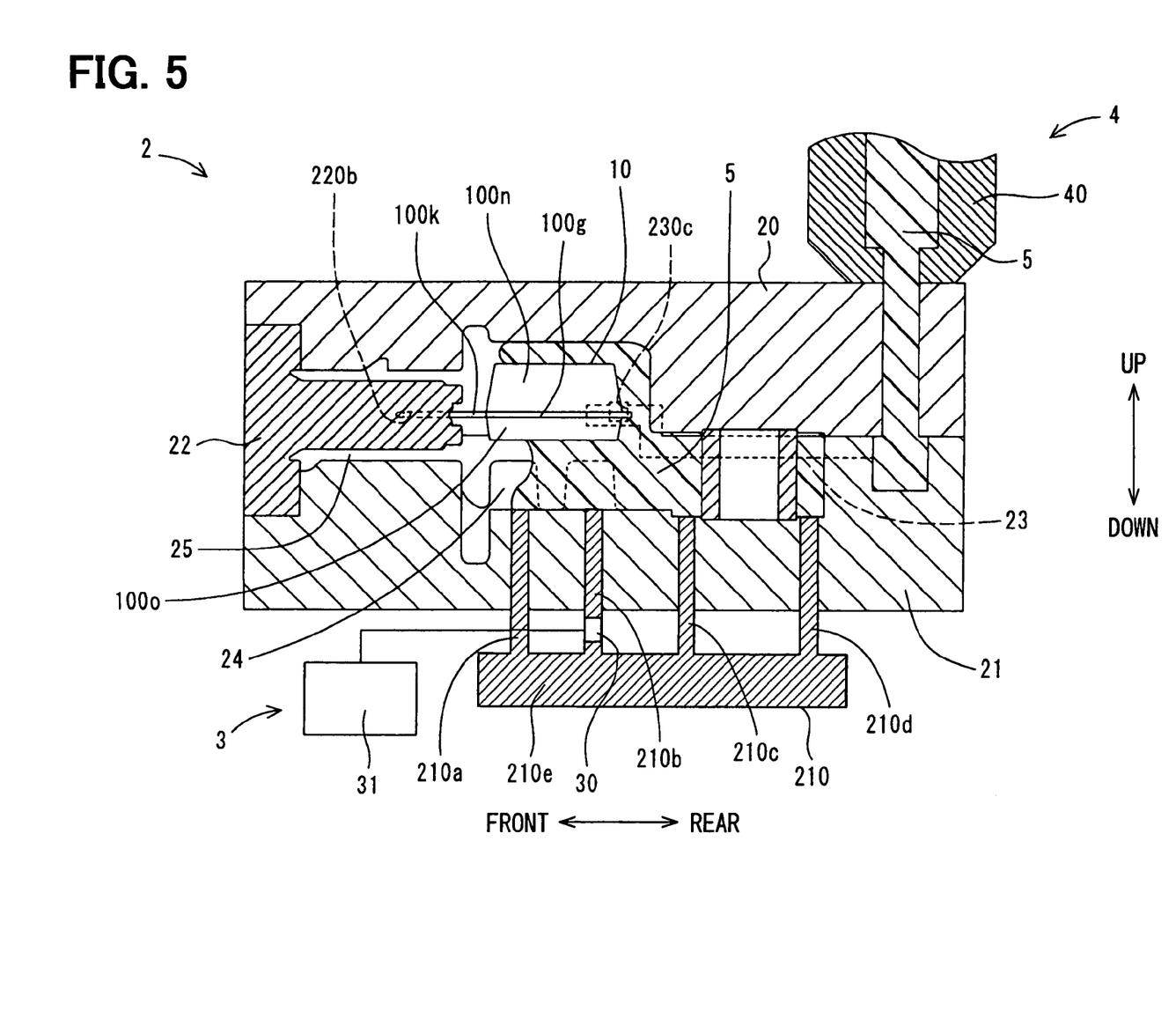
FIG. 5 is a cross-sectional view of the molding die at a time of resin injection and configuration of the resin leak detection device.
Figure 6:
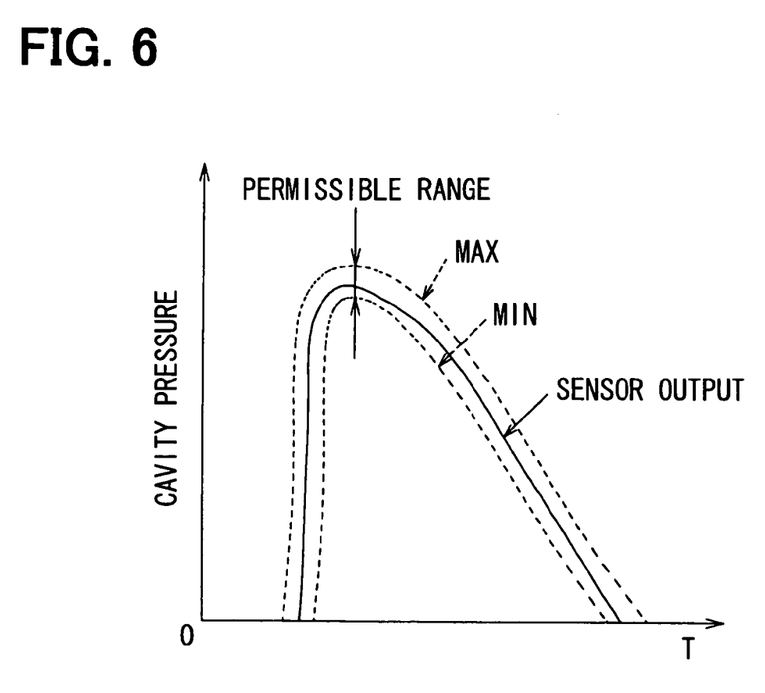
FIG. 6 is a diagram illustrating pressure change in time in a case cavity in a standard process.
Figure 7:
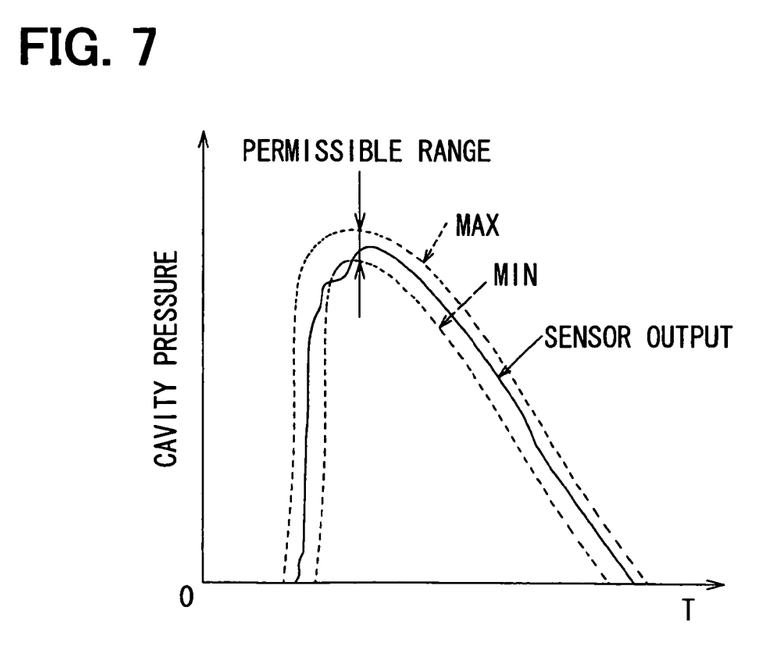
FIG. 7 is a diagram illustrating pressure change in time in the case cavity with a little quantity of resin leak.
Figure 8:
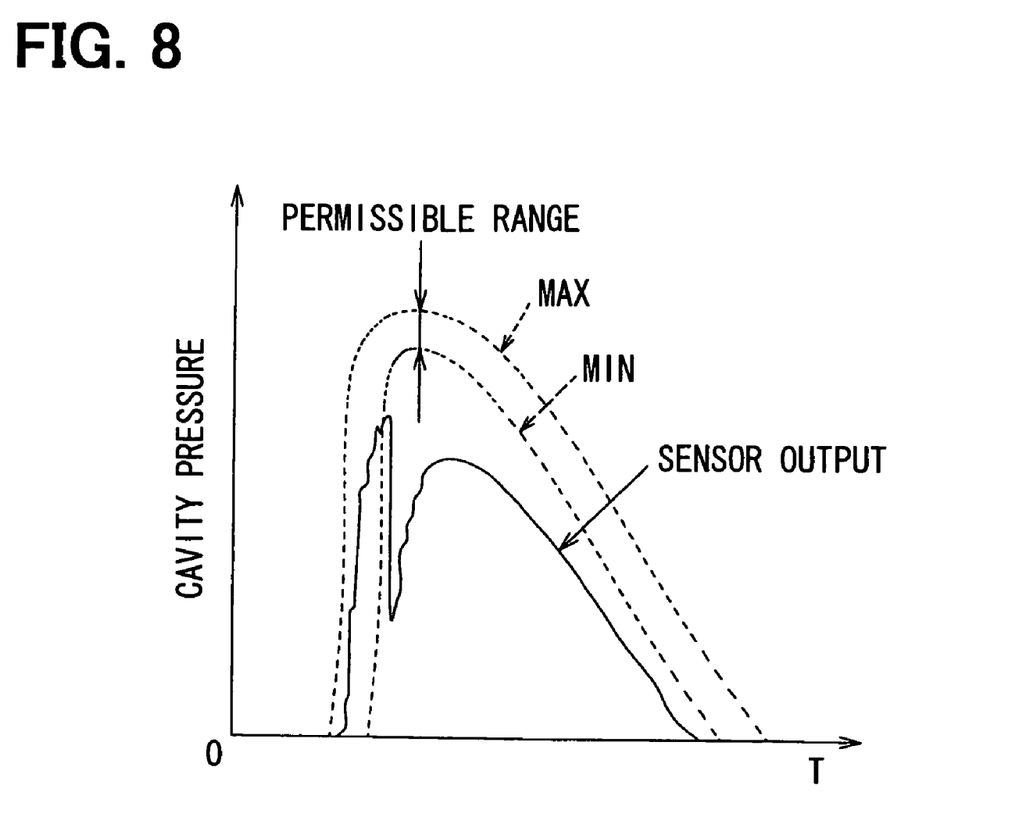
FIG. 8 is a diagram illustrating pressure change in time in the case cavity with a large quantity of resin leak.

FIGS. 5 to 8 are referred to in the following to describe the molding method of the case and a resin leak detection method. FIG. 5 is a cross-sectional view of a molding die at the time of the resin injection and the configuration of the resin leak detection device. In FIG. 5, only the electronic circuit part is shown as a side view. FIG. 6 is a diagram illustrating change time of the pressure in the case cavity 24 in the standard process. FIG. 7 is a diagram illustrating time change of the pressure in the case cavity 24 when a little quantity of a resin leak is happening. FIG. 8 is a diagram illustrating time change of the pressure in the case cavity 24 when a large quantity of a resin leak is happening. In addition, the front and rear directions, and the up and down directions in the drawing are used only for the convenience of the description of the configuration.

Melted resin 5 of a specified quantity is injected into the molding die 2 through the nozzle 40 of the resin injector 4 as shown in FIG. 5. The melted resin 5 is injected into the case cavity 24 through the resin supply path 23. Upon having the resin 5 being injected, pressure in the case cavity 24 changes as time passes. The ejector-pins 210a-210d are pressed downward by pressure. The pressure sensor element 30 detects pressure in the case cavity 24 through the ejector-pin 210b, and outputs a corresponding signal.

A resin leak does not occur when the case 11 is molded normally. That is, a resin leak into the upper case 100n and the lower case 100o does not happen. In the course of injection of the resin 5, the pressure in the case cavity 24 steeply rises as shown in FIG. 6, and the pressure falls slowly afterwards as time elapses. In addition, the pressure value stays within a permissible range, or the tolerance range, between the maximum value and the minimum value.

In contrast, pressure in the case cavity 24 falls temporarily in the course of molding when a resin leak into the upper case 100n or the lower case 100o occurred. For example, pressure temporarily decreases to be smaller than the lower limit of the criterion in the upward trend of pressure change as shown in FIG. 7 when there is a little quantity of a resin leak. However, the pressure returns to the tolerance range afterwards. When the quantity of a resin leak is greater, the pressure decreases more largely under the lower limit of the criterion in the upward trend of pressure change as shown in FIG. 8. In addition, the pressure does not return to be within the tolerance range.

The resin leak detector 31 compares a detection result of the sensor element 30 with the lower limit and the upper limit of the criterion that are set prior to detection. When the detection result of the pressure sensor element 30 becomes smaller than the lower limit of the criterion, it is determined that a resin leak has occurred.

The advantageous effects of the invention are described in the following. That is, a resin leak into the upper case 100n and the lower case 100o without cutting the electronic device 1 according to the first embodiment. This is because pressure in the case cavity 24 detected by the sensor element 30 decreases temporarily to be smaller than the lower limit of the criterion when a resin leak into the cases 100n,100o occurs. That is, the resin leak detector 31 can detect and determine the resin leak by comparing the pressure in the standard process and the currently detected pressure.

In addition, according to the first embodiment, the false detection of the resin leak can be prevented by setting a permissible tolerance range for the pressure data. That is, by considering the tolerance for the resin leak determination criterion, the false detection of the resin leak due to the variation of the pressure in the standard process is prevented.

Furthermore, according to the first embodiment, the ejector-pin 210b can detect pressure in the case cavity 24 securely by having the pressure sensor element 30 buried therein.

Second Embodiment

The resin leak detection method and apparatus in the second embodiment are explained in the following.

Figure 9:
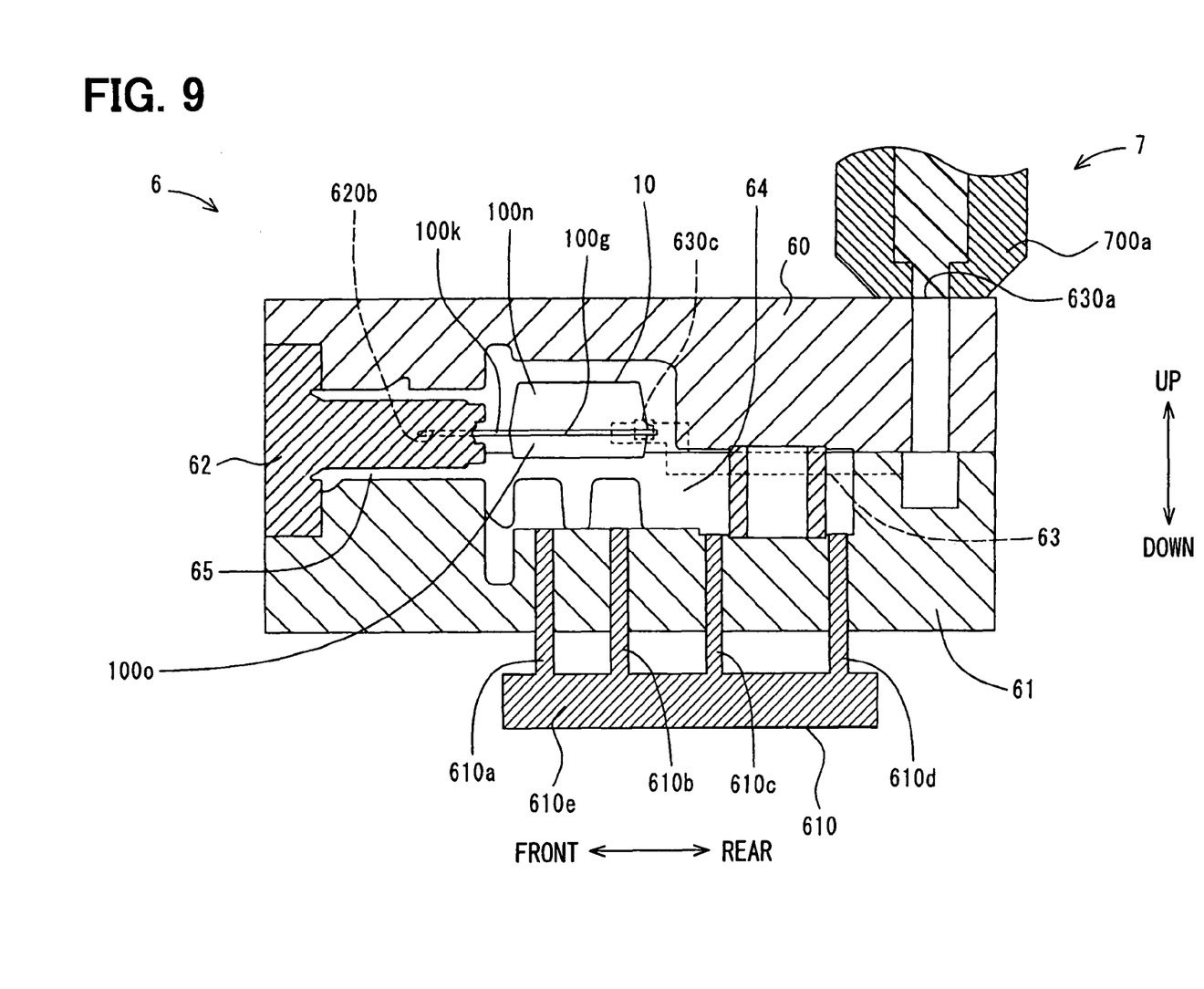
FIG. 9 is a cross-sectional view of the molding die in a second embodiment and configuration of the resin leak detection apparatus.
Figure 10:
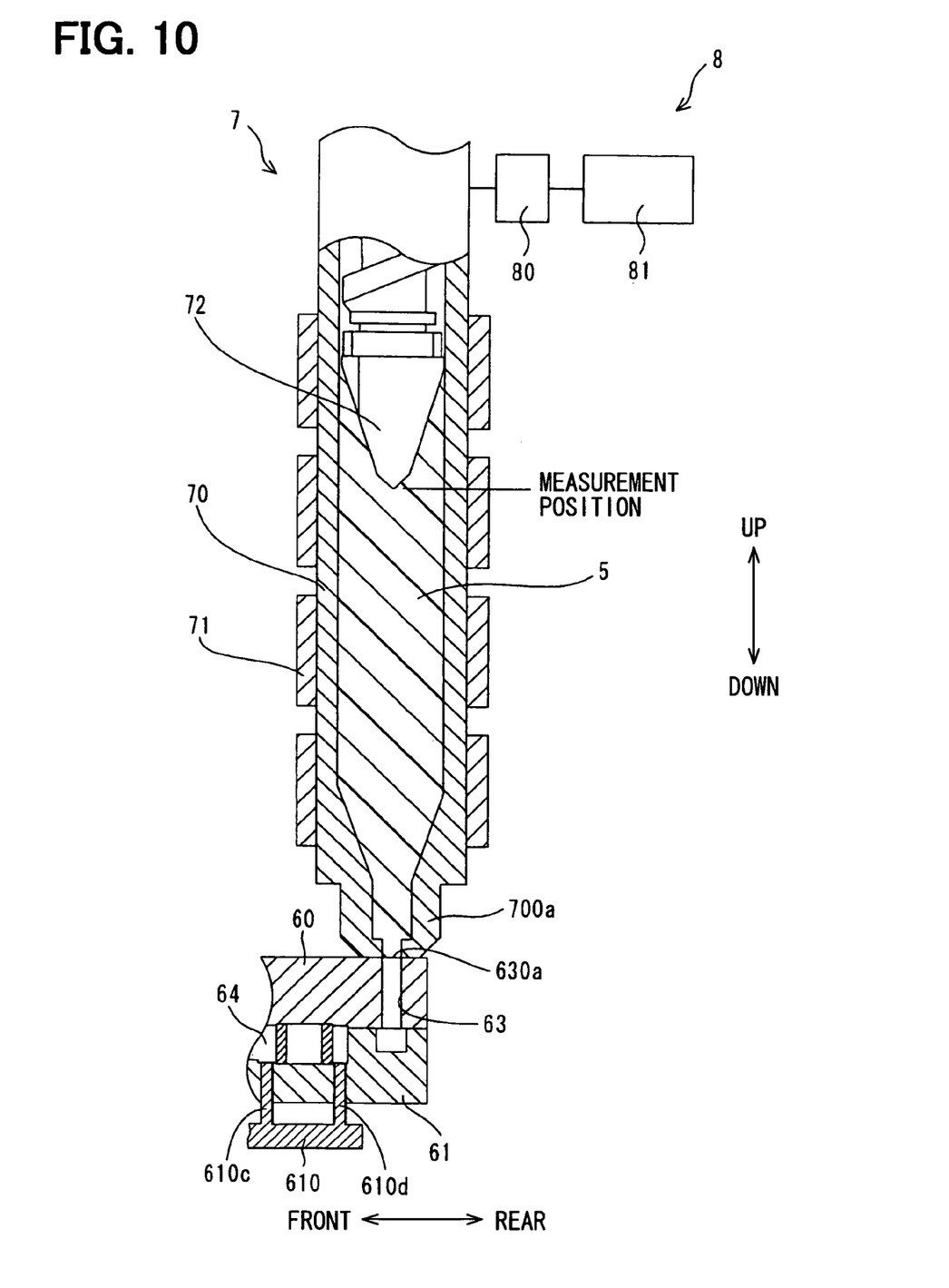
FIG. 10 is a cross-sectional view of a resin injector in a proximity of cylinder.

First, a molding die and configuration of a resin leak detector are explained referring to FIGS. 9 and 10. FIG. 9 is a cross-sectional view of the molding die in the second embodiment and the configuration of the resin leak detection apparatus. In FIG. 9, only an electronic circuit part is shown as a side view. FIG. 10 is a cross-sectional view of the resin injector 7 in the proximity of the cylinder 70. In FIG. 10, only a screw part is shown as a side view. In addition, the front and rear directions, and the up and down directions in the drawing are used only for the convenience of the description of the configuration.

The molding die 6 includes a slide core 62 and a resin supply path 63 with an upper die 60 and a lower die 61 as shown in FIG. 9. The lower die 61 has an ejector 610. However, unlike the ejector 210 in the first embodiment, the ejector 610 does not have the pressure sensor element buried therein. Each part of the molding die 6 is same as each part of the molding die 2 in the first embodiment except for the pressure sensor element.

The electronic circuit part 10 is positioned in a case cavity 64 with the connector terminals 100j-100m in a condition being fitted in fit hole parts 620a-620d.

A resin injector 7 (a resin injection device) is a device for injecting melted resin of the specified quantity into the case cavity 64 of the molding die 6. The resin injector 7 includes a cylinder 70, a band heater 71 and a screw 72.

The cylinder 70 is a cylindrical member that has resin filled therein. On a downward tip of the cylinder 70, a nozzle 700a is formed integrally as one body. The nozzle 700a is connected to an opening 630a of the resin supply path 63.

The band heater 71 is a device that melts resin by heating. The band heater 71 is fixed on a circumference of the cylinder 70.

The screw 72 is a member to measure resin in the cylinder 70. In addition, the screw 72 is a member that injects melted resin in a compressingly pressurized manner into the case cavity 64 of the molding die 6 from the cylinder 70 after melting the resin with the heat from the band heater 71. The screw 72 can be rotated in the cylinder 70, and can be movable in the axial direction of the cylinder 70.

A resin leak detection apparatus 8 is an apparatus detecting a resin leak into the upper case 100n and the lower case 100o based on a residual resin quantity in the resin injector 7. The resin leak detection apparatus 8 includes a residue detector 80 and a resin leak detector 81.

The residue detector 80 is a device detecting a residual resin quantity in the resin injector 7, or, more practically, a residual resin quantity in the cylinder 70. The residue detector 80 detects a residual resin quantity in the cylinder 70 based on the positional information of the downward tip of the screw 72 derived from the resin injector 7, and outputs a corresponding signal. As for the residue detector 80, an input terminal is connected to the resin injector 7, and the output terminal is connected to the resin leak detector 81.

The resin leak detector 81 is a device determining a resin leak into the upper case 100n and the lower case 100o based on a detection result of the residue detector 80. In the resin leak detector 81, data of the residual resin quantity in the cylinder 70 after the resin injection in the standard process is set as a criterion with a predetermined tolerance range. More practically, the upper and lower limits of the residual resin quantity in the cylinder 70 after the resin injection are set in the detector 81.

Figure 11:
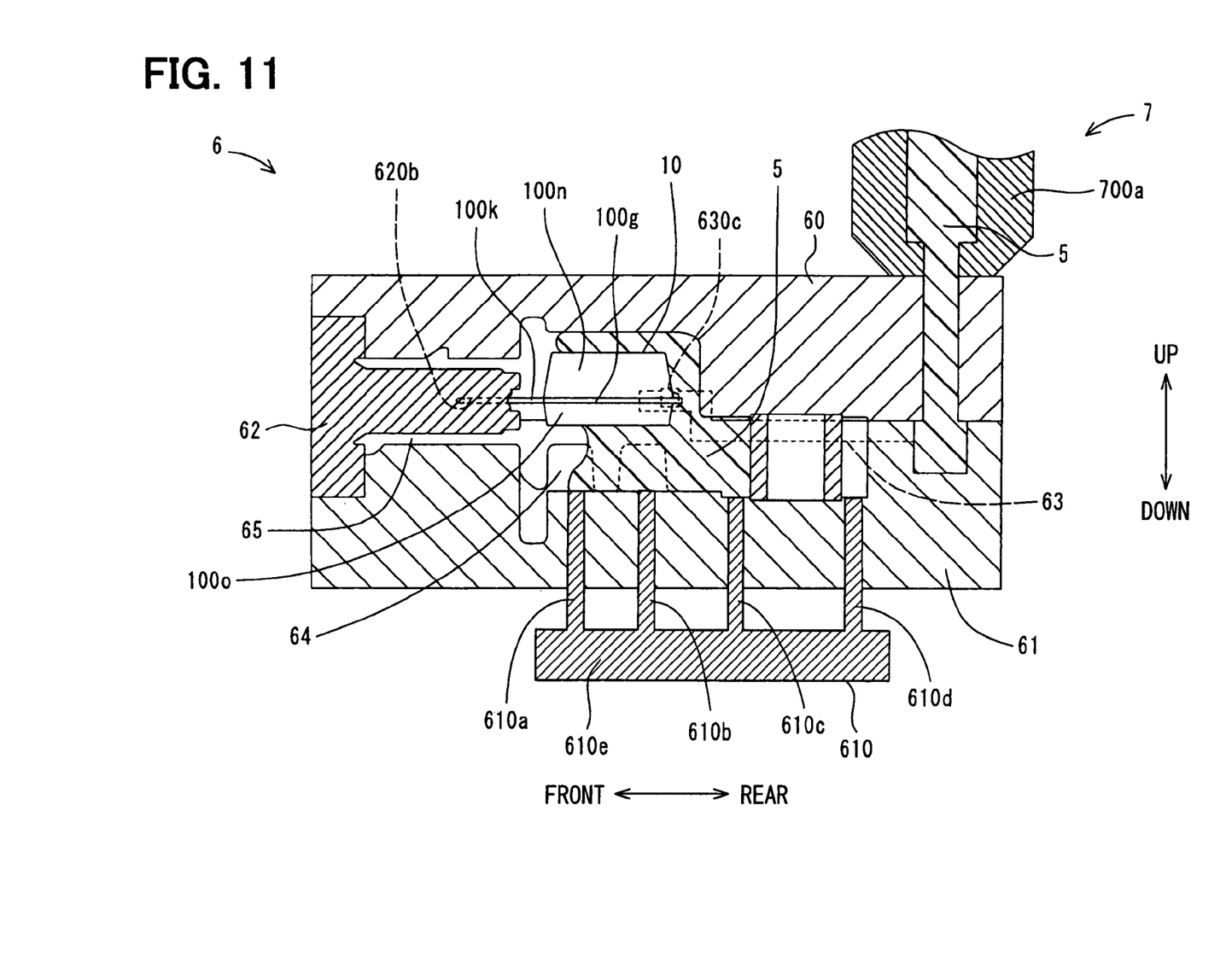
FIG. 11 is a cross-sectional view of the molding die at a time of resin injection and configuration of the resin leak detection apparatus.
Figure 12:
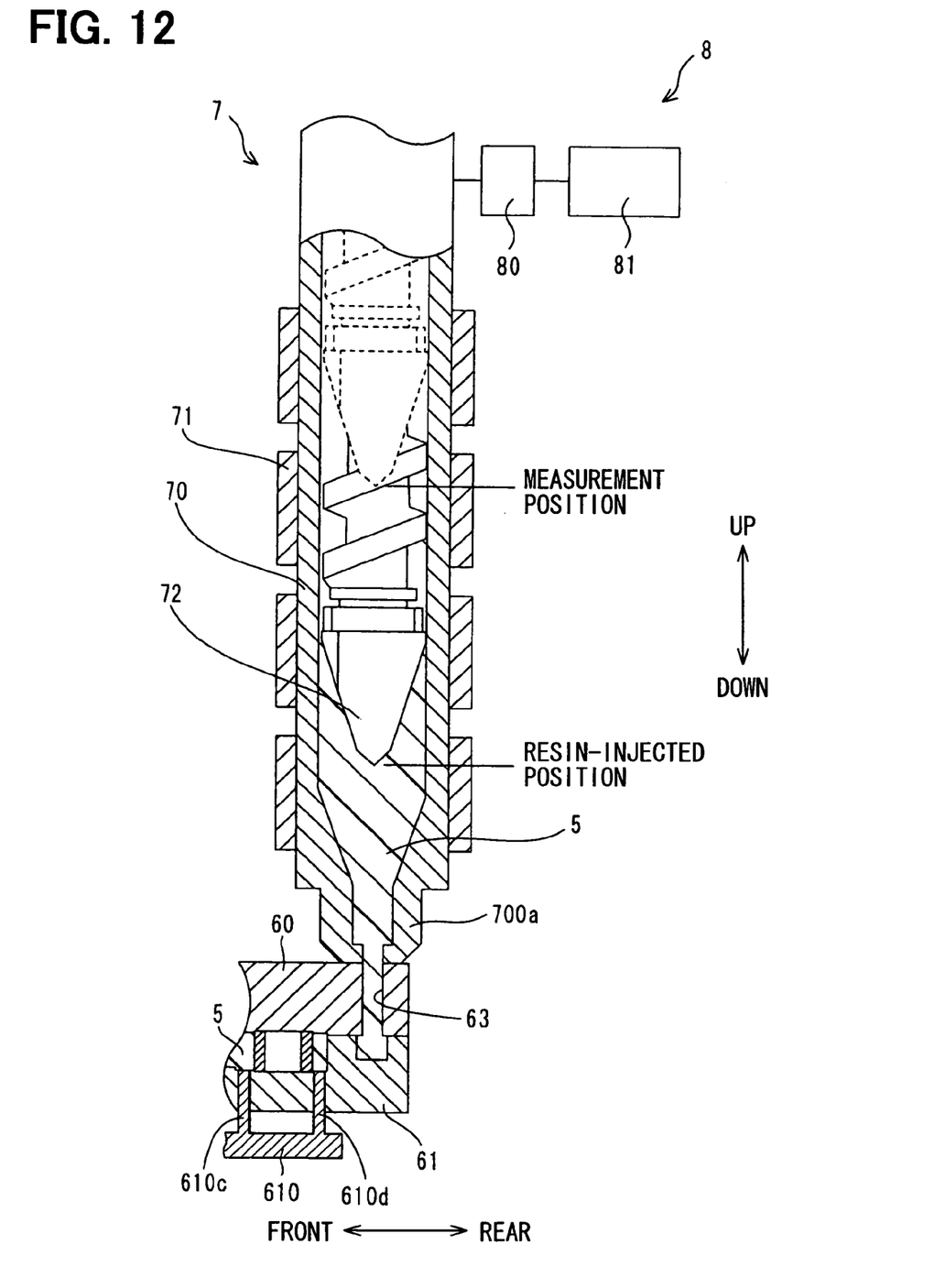
FIG. 12 is a cross-sectional view of the resin injector at a proximity of cylinder after resin injection in the standard process.
Figure 13:
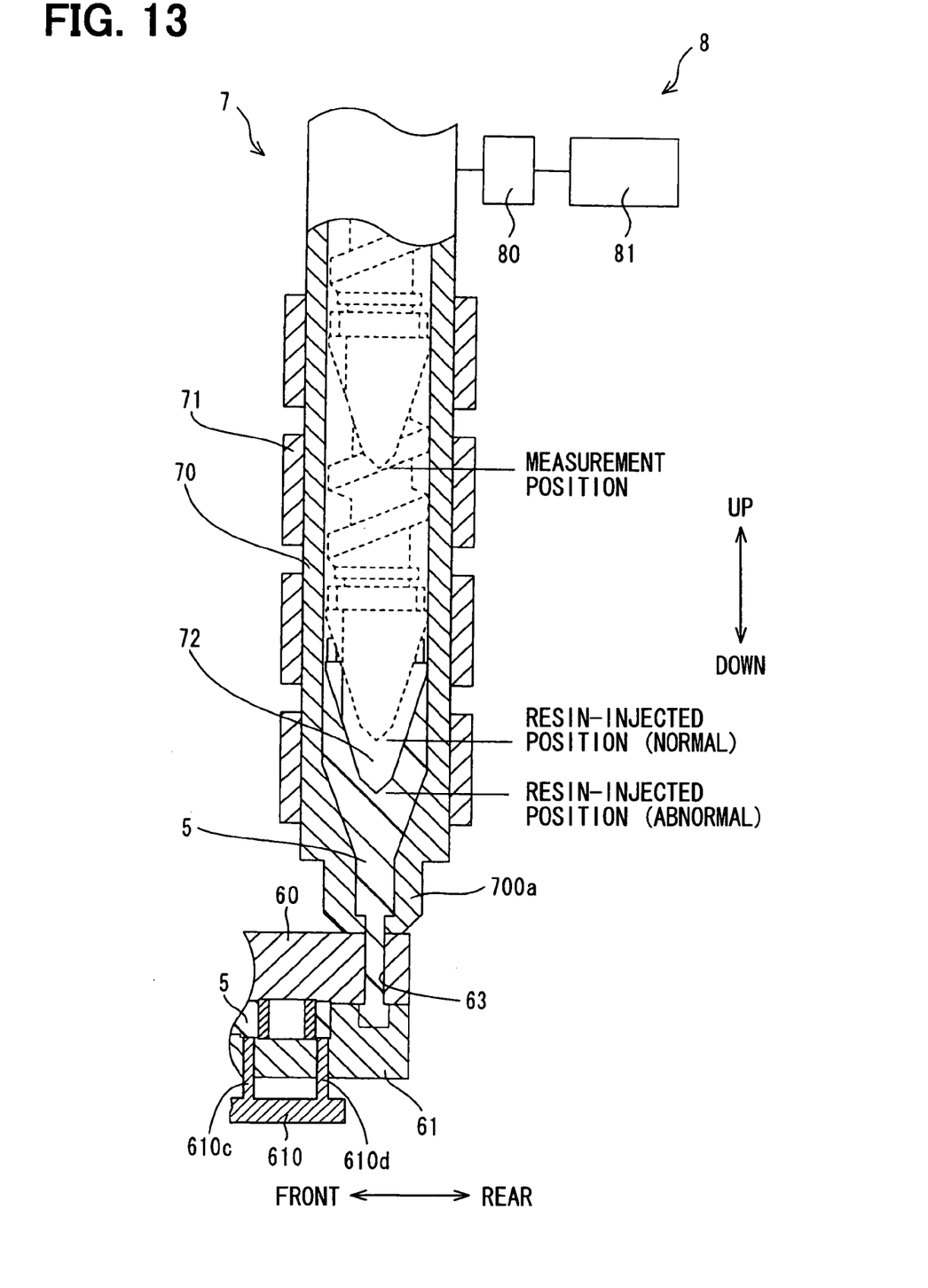
FIG. 13 is a cross-sectional view of the resin injector in a proximity of the cylinder after resin injection at a time of the resin leak outbreak.

FIGS. 10 to 13 are referred to in the following for describing the molding method of the case and the resin leak detection method. FIG. 11 is a cross-sectional view of the molding die at the time of the resin injection and the configuration of the resin leak detection apparatus. In FIG. 11, only an electronic circuit part is shown as a side view. FIG. 12 is a cross-sectional view of the resin injector 7 at the proximity of the cylinder 70 after the resin injection in the standard process. FIG. 13 is a cross-sectional view of the resin injector 7 at the proximity of the cylinder 70 after the resin injection at the time of the resin leak outbreak. In FIGS. 12 and 13, only the screw 72 is shown as a side view. In addition, the front and rear directions, and the up and down directions in the drawing are used only for the convenience of the description of the configuration.

The resin 5 of the specified quantity is filled up in the cylinder 70 under the screw 72 as shown in FIG. 10 when the screw 72 moves up by rotating. More practically, the resin 5 of the specified quantity that is slightly greater than an injectable quantity of the molding die 6 is filled up in the cylinder 70. (The position of the screw 72 is at "Measurement Position" in FIG. 10.) The resin 5 filled up in the cylinder 70 is melted by the band heater 71. Then, the screw 72 moves downward. By the move of the screw 72, the melted resin 5 in the cylinder 70 is pressurized to be injected into the molding die 6 as shown in FIG. 11. The melted resin 5 is injected into the case cavity 64, the connector cavity 65 and through the resin supply path 63. The residue of the resin 5-remains in the cylinder 70 under the screw 72 as shown in FIG. 12 when injection of the resin 5 into the molding die 6 is complete. (The position of the screw 72 is at "Resin-Injected Position" in FIG. 12.) The residual quantity of the resin 5 in the cylinder 70 is determined in this case by the position of the downward tip of the screw 72. The resin injector 7 outputs the positional information of the downward tip of screw 72 to the residue detector 80. The residue detector 80 detects a residual quantity of the resin 5 in the cylinder 70 based on the positional information of the downward tip of the screw 72, and outputs a corresponding signal.

When the case 11 is molded normally, the resin leak into the upper case 100n and the lower case 100o does not occur. The residual quantity of the resin 5 in the cylinder 70 stays within the tolerance range between the maximum and minimum values of the criterion. More practically, the position of the downward tip of the screw 72 stays within a predetermined range.

In contrast, the residual quantity of the resin 5 in the cylinder 70 decreases when the resin leak into the upper case 100n and the lower case 100o has occurred. In other words, the residual quantity of the resin 5 in the cylinder 70 becomes smaller than the lower limit of the criterion. The position of the downward tip of the screw 72 becomes lower than the position of the tip in the standard process as shown in FIG. 13. (The position of the screw 72 comes to a "Resin-Injected Position (Abnormal)" in FIG. 13 that is lower than the position of the standard process designated as a "Resin Injected Position (Normal).")

The resin leak detector 81 compares, with the lower limit of the predetermined criterion, a detection result of the residue detector 80. If the detection result of the detector 80 is smaller than the lower limit of the criterion, it is determined that the resin leak has occurred.

The advantageous effects of the invention are explained in the following. That is, the resin leak into the upper case 100n and the lower case 100o is detected without cutting the electronic device 1 according to the second embodiment. This is because the residue amount of the resin 5 in the cylinder 70 after the resin injection is detected based on the positional information of the downward tip of the screw 72. The detected position of the tip of the screw 72 is compared with the position of the tip in the standard process, thereby enabling the resin leak detector 81 to determine that the resin is leaking based on the decrease of the residue amount of the resin in the cylinder 70 that is derived from the positional information of the screw 72.

In addition, according to the second embodiment, the false detection of the resin leak can be prevented by setting the tolerance range for the data of the residual resin quantity in the cylinder 70 after the resin injection in the standard process, that is, by setting the permissible tolerance range between an upper limit and a lower limit for the criterion. The residual resin quantity in the cylinder 70 after the resin injection varies in the standard process. By setting the tolerance range for the resin leak determination criterion, the false detection of the resin leak can be prevented.

Furthermore, according to the second embodiment, the residual resin quantity in the cylinder 70 after the resin injection can be securely determined based on the position of the downward tip of the screw 72.

Although the present invention has been fully described in connection with the preferred embodiment thereof with reference to the accompanying drawings, it is to be noted that various changes and modifications will become apparent to those skilled in the art.

For example, though the above embodiments are described as an example implementation of a leak detection apparatus to an acceleration sensor device, the present disclosure may also be applied to other types of sensor devices.

Such changes and modifications are to be understood as being within the scope of the present invention as defined by the appended claims.

What is claimed is:

1. A method for resin leak detection in an electronic circuit case, wherein an electronic circuit unit of an electronic device is placed in a case forming space of a mold to be sealed by an outer case that is made of resin injected therein, and wherein the electronic circuit unit has an electronic component, a substrate that provides wiring for the electronic component and the electronic circuit case that houses and seals the electronic component together with the substrate, the method comprising:

detecting resin leak based on a pressure in the case forming space where the resin is injected.

2. The method of claim 1, wherein
the pressure of the case forming space is compared with a pressure of the case forming space in a standard process, and
the resin leak is detected based on a result of the comparison.

3. The method of claim 2, wherein
the resin is determined to be leaking if the pressure in the case forming space is smaller than the pressure in the standard process.

4. The method of claim 2, wherein
the pressure in the case forming space in the standard process has a predetermined range of tolerance.

5. An apparatus for detecting resin leak in an electronic circuit case, wherein an electronic circuit unit of an electronic device is placed in a case forming space of a mold to be sealed by an outer case that is made of resin injected therein, and wherein the electronic circuit unit has an electronic component, a substrate that provides wiring for the electronic component and the electronic circuit case that houses and seals the electronic component together with the substrate, the apparatus comprising:
 a pressure detector capable of detecting a pressure in the case forming space that has the resin injected therein; and
 a resin leak detector capable of determining the resin leak based on a detection result of the pressure detector.

6. The apparatus of claim 5, wherein
the resin leak detector determines the resin leak by comparing detection result of the pressure detector with a predetermined pressure of the case forming space in a standard process.

7. The apparatus of claim 6, wherein
the resin leak detector determines that the resin is leaking if the pressure in the case forming space is smaller than the pressure in the standard process.

8. The apparatus of claim 6, wherein
the pressure of the case forming space in the standard process has a predetermined amount of tolerance.

9. The apparatus of claim 5, wherein
the mold has a rod shape member,
a top face of the rod shape member forms a portion of an inner surface of the case forming space,
a top portion of the rod shape member protrudes into the case forming space for pushing the case away from the mold after case formation, and
the pressure detector is disposed in the rod shape member.

10. The apparatus of claim 9, wherein
the pressure detector in the rod shape member is positioned outside of the mold.

11. An apparatus for detecting resin leak in an electronic circuit case, wherein an electronic circuit unit of an electronic device is placed in a case forming space of a mold to be sealed by an outer case that is made of resin injected therein, and wherein the electronic circuit unit has an electronic component, a substrate that provides wiring for the electronic component and the electronic circuit case that houses and seals the electronic component together with the substrate, the apparatus comprising:
 a pressure detector capable of detecting a pressure in the case forming space that has the resin injected therein; and
 a resin leak detector capable of determining the resin leak based on a detection result of the pressure detector; wherein
 the mold has an ejector,
 a top face of the ejector forms a portion of an inner surface of the case forming space,
 a top portion of the ejector protrudes into the case forming space for pushing the case away from the mold after case formation, and
 the pressure detector is disposed in the ejector.

12. A method for resin leak detection in an electronic circuit case, wherein an electronic circuit unit of an electronic device is placed in a case forming space of a mold to be sealed by an outer case that is made of resin injected therein, and wherein the electronic circuit unit has an electronic component, a substrate that provides wiring for the electronic component and the electronic circuit case that houses and seals the electronic component together with the substrate, the method comprising:
 detecting resin leak based on a pressure in the case forming space where the resin is injected, wherein
 the mold has an ejector,
 a top face of the ejector forms a portion of an inner surface of the case forming space,
 a top portion of the ejector protrudes into the case forming space for pushing the case away from the mold after case formation, and
 the pressure detector is disposed in the ejector.

* * * * *